(12) United States Patent
Kawabata

(10) Patent No.: US 6,472,610 B1
(45) Date of Patent: Oct. 29, 2002

(54) SUPPORT STRUCTURE FOR ELECTRONIC COMPONENT

(75) Inventor: Kenji Kawabata, Shiga-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/059,211

(22) Filed: Apr. 13, 1998

(30) Foreign Application Priority Data

Apr. 15, 1997 (JP) .............................................. 9-097542
Feb. 18, 1998 (JP) ........................................... 10-036337

(51) Int. Cl.[7] ................................................ H05K 1/16
(52) U.S. Cl. ...................... 174/260; 174/264; 174/266; 361/768; 310/313 R; 310/348
(58) Field of Search ................................. 174/260, 263, 174/266, 262, 264, 265; 361/760, 761, 768, 771, 773, 774, 791; 310/313 R, 348

(56) References Cited

U.S. PATENT DOCUMENTS 3,991,347 A * 11/1976 Hollyday ................. 174/260 X
4,902,237 A * 2/1990 Huetson ....................... 439/83

FOREIGN PATENT DOCUMENTS

JP 4-14286 * 1/1992

* cited by examiner

Primary Examiner—Kamand Cuneo
(74) Attorney, Agent, or Firm—Keating & Bennett, LLP

(57) ABSTRACT

A support structure of a piezoelectric vibrator greatly increase a bonding strength between a conductive bonding agent and a mounting substrate. The support structure may be provided in a piezoelectric transformer, a piezoelectric vibrator, a gyroscope, and a multilayered piezoelectric component. The mounting substrate has first to third terminal electrodes provided on both top and bottom surfaces thereof and includes first to third through holes being provided at a central portion of the terminal electrodes, respectively. After the piezoelectric transformer element is positioned on the mounting substrate such that the transformer element is spaced slightly apart from the top surface of the mounting substrate by a predetermined distance, a conductive bonding agent is applied to the node N of vibration of an input electrode of the piezoelectric transformer element and the first terminal electrode, and the first through hole is filled with the conductive bonding agent. Similarly, the conductive bonding agent is applied to an output electrode and the second terminal electrode of the piezoelectric transformer, and the third through hole is also filled with the conductive bonding agent.

9 Claims, 7 Drawing Sheets

SUPPORT STRUCTURE FOR ELECTRONIC COMPONENT

BACKGROUND OF THE INVENTION

1. Field of the Invention

The present invention relates to a support structure for an electronic component such as a piezoelectric vibrator, and also relates to an electronic component such as a piezoelectric transformer, a gyroscope and a multilayered piezoelectric component including the inventive support structure.

2. Description of the Related Art

A conventional electronic component and support structure, for example, in the form of a piezoelectric transformer, is shown in FIGS. 17 and 18. A piezoelectric transformer 80 may be used in, for example, a high-voltage power-supply circuit of an inverter for a back light of a liquid-crystal display, an inverter for switching on a fluorescent lamp or a copier, and other similar devices. The piezoelectric transformer 80 includes a piezoelectric transformer element 85 having input electrodes 82 and 83 and an output electrode 84 provided on a piezoelectric plate 81 made of a piezoelectric ceramic in the shape of a rectangular flat-plate. The input electrodes 82 and 83 are arranged so that they are located opposite to each other on the top and bottom surfaces of a half section which in FIGS. 17 and 18 is on the left side of the piezoelectric plate 81 as seen in FIGS. 17 and 18. The output electrode 84 is disposed on the surface on the right side of the piezoelectric plate 81 of FIGS. 17 and 18.

In the piezoelectric transformer 80, the piezoelectric transformer element 85 operates in a fundamental (primary) vibration mode called a λ/2 mode, wherein a node (node point) N of vibration at which the vibration displacement is zero is present at a position located at one half of a length of the piezoelectric plate 81, and a maximum point of vibration displacement is located at the two ends of the piezoelectric plate 81. Therefore, in such a piezoelectric transformer 80, in order to minimize the suppression of vibration of the piezoelectric plate 81, the piezoelectric transformer element 85 is supported on a mounting substrate 89 at the node N of vibration at which the displacement of the vibration of the piezoelectric plate 81 is minimum.

A conductive bonding agent 86 or the like is used to electrically and physically connect the piezoelectric plate 81 to the mounting substrate 89. Each of the electrodes 82 to 84 is electrically connected by the conductive bonding agent 86 to a terminal electrode 90 disposed on the mounting substrate 89.

As shown in FIG. 17, after the piezoelectric transformer element 85 is placed on the mounting substrate 89 to which the conductive bonding agent 86 is applied in advance, the conductive bonding agent 86 is hardened, and thereby the mounting is completed. Alternatively, the conductive bonding agent 86 is applied to the piezoelectric transformer element 85 in advance and then the transformer 85 including the conductive bonding agent 86 is placed on the mounting substrate 89, the conductive bonding agent 86 is hardened, and thereby the mounting is completed. Alternatively, as shown in FIG. 18, after the piezoelectric transformer element 85 is positioned on the mounting substrate 89, the conductive bonding agent 86 is applied to the side surface of the piezoelectric transformer element 85 by a dispenser 92 and the like, and hardened, thereby the mounting is performed.

In the conventional piezoelectric transformer 80, since the conductive bonding agent 86 used when the piezoelectric transformer element 85 is mounted on the mounting substrate 89 must have a certain degree of elasticity, denatured urethane and silicon, soft epoxy, and the like is used for as a binder material included therein. Although these materials cause the conductive bonding agent 86 to have elasticity, the materials have a weak bonding force. In particular, the bonding force with respect to the solder used in the electrodes 82 to 84 of the mounting substrate 89 is weak, and when an impact or the like is applied to the piezoelectric transformer 80 after it is mounted on the substrate 89, problems such as peeling or removal of the conductive bonding agent 86 from the electrodes 82 to 84 of the mounting substrate 89 occurs.

SUMMARY OF THE INVENTION

In order to overcome the problems described above, the preferred embodiments of the present invention provide a novel support structure for an electronic component including a piezoelectric vibrator, a piezoelectric transformer, a gyroscope or a multilayered piezoelectric component, which support structure is constructed to improve bonding strength between a conductive bonding agent and a mounting substrate without decreasing an elasticity of the conductive bonding agent.

The preferred embodiments of the present invention provide a support apparatus for an electronic component including a mounting substrate on which the electronic component is mounted, at least one terminal electrode provided on the mounting substrate, a hole provided on the mounting substrate and located at a position corresponding to a position of the terminal electrode, and a conductive bonding agent disposed in the hole and arranged to electrically connect the electronic component to the terminal electrode.

It is also preferred that the at least one terminal provided on the mounting substrate has a hole formed therein, which hole is located in alignment with the hole formed in the mounting substrate, with the conductive bonding agent being located in the hole formed in the mounting substrate and the hole formed in the at lest one terminal.

The preferred embodiments of the present invention provide an electronic component including a mounting substrate on which the electronic component is mounted, at least one terminal electrode provided on the mounting substrate, a hole provided on the mounting substrate and located at a position corresponding to a position of the terminal electrode, and a conductive bonding agent disposed in the hole and arranged to electrically connect the electronic component to the terminal electrode.

The preferred embodiments of the present invention provide a piezoelectric vibrator including a piezoelectric body and a plurality of input and output electrodes provided on a surface of the piezoelectric body, a mounting substrate on which the piezoelectric body is mounted, a terminal electrode provided on the mounting substrate, a hole provided on the mounting substrate and located at a position corresponding to a position of the terminal electrode, and a conductive bonding agent disposed in the hole and arranged to electrically connect at least one of the input and output electrodes to the terminal electrode.

According to another preferred embodiment of the present invention, a piezoelectric transformer includes a piezoelectric transformer element including a piezoelectric plate and an input electrode and an output electrode disposed on the piezoelectric plate, a mounting substrate on which the piezoelectric transformer element is mounted, a plurality of terminal electrodes provided on the mounting substrate, and a plurality of holes provided in the mounting substrate and located at positions corresponding to locations of the terminal electrodes, and a conductive bonding agent located in the holes and arranged to electrically connect at least one of the input and output electrodes to at least one of the terminal electrodes.

Another preferred embodiment of the present invention provides a gyroscope including a prismatic vibrator with a plurality of piezoelectric elements provided on the surface of the prismatic vibrator, each of the piezoelectric elements including a piezoelectric body and an electrode on the surface of the piezoelectric body, a mounting substrate on which the prismatic vibrator is mounted, a terminal electrode provided on the mounting substrate; a hole provided in the mounting substrate and located at a position corresponding to a location of the terminal electrode, and a conductive bonding agent located in the hole and arranged to electrically connect at least one of the electrodes of the piezoelectric elements to the terminal electrode.

A further preferred embodiment of the present invention further provides a multilayered piezoelectric component including a multilayered piezoelectric element vibrating in a longitudinal vibration mode, the multilayered piezoelectric element having a multilayered body structured in such a way that a plurality of piezoelectric layers and a plurality of electrodes define a plurality of layers which are laminated to each other in an integral stack, the polarization directions of adjacent ones of the piezoelectric layers of the multilayered body being disposed opposite to each other, a plurality of input and output electrodes provided on the surface of the multilayered body, a mounting substrate on which the multilayered piezoelectric element is mounted, a terminal electrode provided on the mounting substrate, a hole provided in the mounting substrate and located at a position corresponding to a location of the terminal electrode and a conductive bonding agent disposed in the hole and arranged to electrically connect at least one of the input and output electrodes to the terminal electrode.

The holes which are provided in the mounting substrate can be through-holes and via-holes which have a conductor provided in an inner wall thereof and also through-holes which do not have a conductor provided in the inner wall, and also blind holes, and other types of holes.

As a result of filling the holes with a conductive bonding agent, the contact area between the conductive bonding agent and the mounting substrate is increased. In addition, with this arrangement of the conductive bonding agent filled in the hole, the conductive agent functions as a wedge so that the conductive agent is firmly and reliably located at the inner wall of the hole. Therefore, the bonding strength between the conductive bonding agent and the mounting substrate is increased.

Other features and advantages of the present invention will become apparent from the following description of preferred embodiments of the invention which refers to the accompanying drawings, wherein like reference numerals indicate like elements to avoid duplicative description.

DETAILED DESCRIPTION OF PREFERRED EMBODIMENTS

Figure 1:
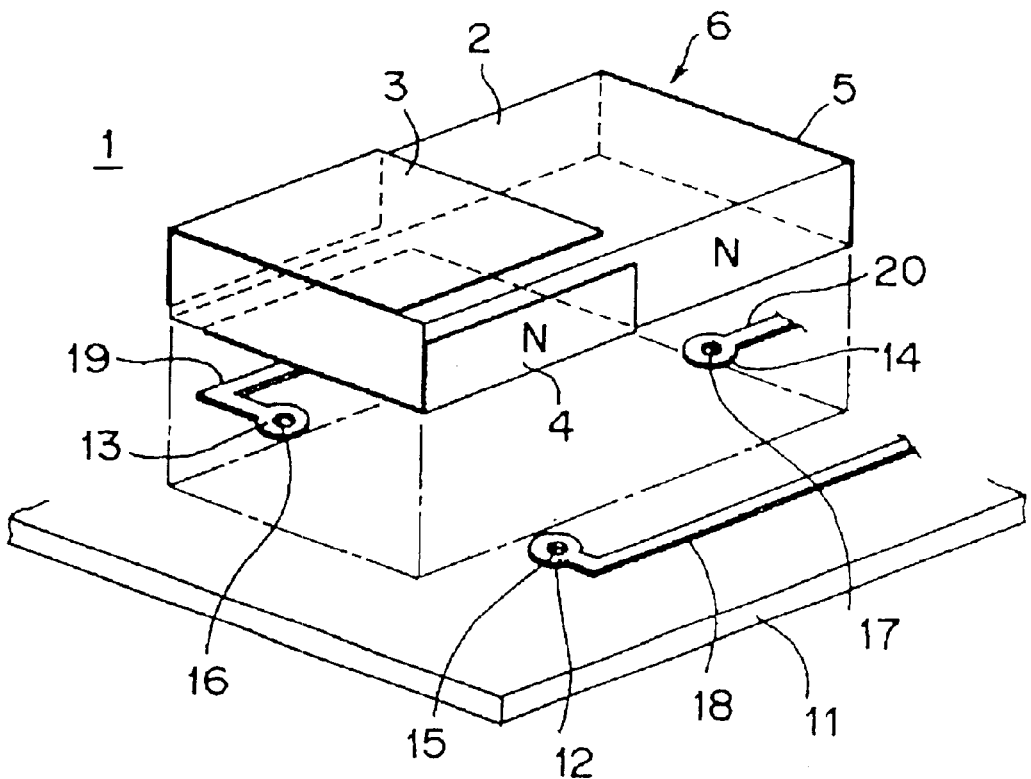
FIG. 1 is an exploded perspective view showing a first preferred embodiment of an electronic component, such as a piezoelectric transformer, of the present invention.

A first preferred embodiment of a support apparatus and an electronic component including such novel support apparatus will be described by using as an example a piezoelectric transformer used for an inverter for a back light of a liquid-crystal display. As shown in FIG. 1, an electronic component such as a piezoelectric transformer 1 includes a piezoelectric transformer element 6 and a support apparatus including a mounting substrate 11 for mounting the piezoelectric transformer element 6. The piezoelectric transformer element 6 is preferably a Rosen type transformer. This Rosen-type piezoelectric transformer element 6 is constructed such that input electrodes 3 and 4 and an output electrode 5 are provided on a piezoelectric plate 2 preferably made of a piezoelectric ceramic and preferably having a shape of a substantially rectangular flat-plate of a lead-zirconate-titanate-type (PZT) material. The input electrode 3 is provided on the top surface along substantially one half portion of the piezoelectric plate 2 and the input electrode 4 is provided on the bottom surface along substantially one half of the piezoelectric plate 2. The output electrode 5 is provided on the side surface of the of the piezoelectric plate 2 which is opposite to a location of the input electrodes 3 and 4. The input and output electrodes 3 to 5 are preferably provided by a method such as silver baking or other suitable method. Further, by applying a predetermined bias voltage to the electrodes 3 to 5, an input section which in the preferred embodiment shown in FIG. 1 includes a portion of the left half of the piezoelectric plate 2 is polarization processed along the direction of the plate thickness. An output section which in the preferred embodiment shown in FIG. 1 includes a portion of the right half of the piezoelectric plate 2 is polarization-processed along the direction of the length.

In this piezoelectric transformer element 6, when an AC voltage having a frequency which is nearly equal to the natural resonance frequency along the length direction of the piezoelectric transformer element 6 is applied between the input electrodes 3 and 4, the piezoelectric transformer element 6 causes a strong mechanical vibration along the length direction. As a result, an electrical charge is generated in the output section because of the piezoelectric effect, causing an output voltage between the output electrode 5 and the input electrode 4. That is, the input electrode 4 performs a function as an output electrode. The piezoelectric transformer element 6 of the first preferred embodiment utilizes a secondary vibration mode called a λ mode, in which a node N of vibration at which the vibration displacement is zero is located at a position of one fourth of the length of the piezoelectric plate 2 from each of both ends of the piezoelectric plate 2, and a point of maximum vibration is located at the center and at both ends of the piezoelectric plate 2.

The support apparatus includes the mounting substrate 11 and at least one but preferably a plurality of terminal electrodes 12, 13, and 14 (see FIG. 3) which are located on and extend to both top and bottom surfaces of the substrate 11. Through holes 15, 16, and 17 are provided in the mounting substrate 11 and the terminals, more preferably, substantially at the center of the terminal electrodes 12, 13, and 14, respectively. Circuit patterns 18, 19, and 20 are connected to the terminal electrodes 12, 13, and 14, respectively.

Figure 2:
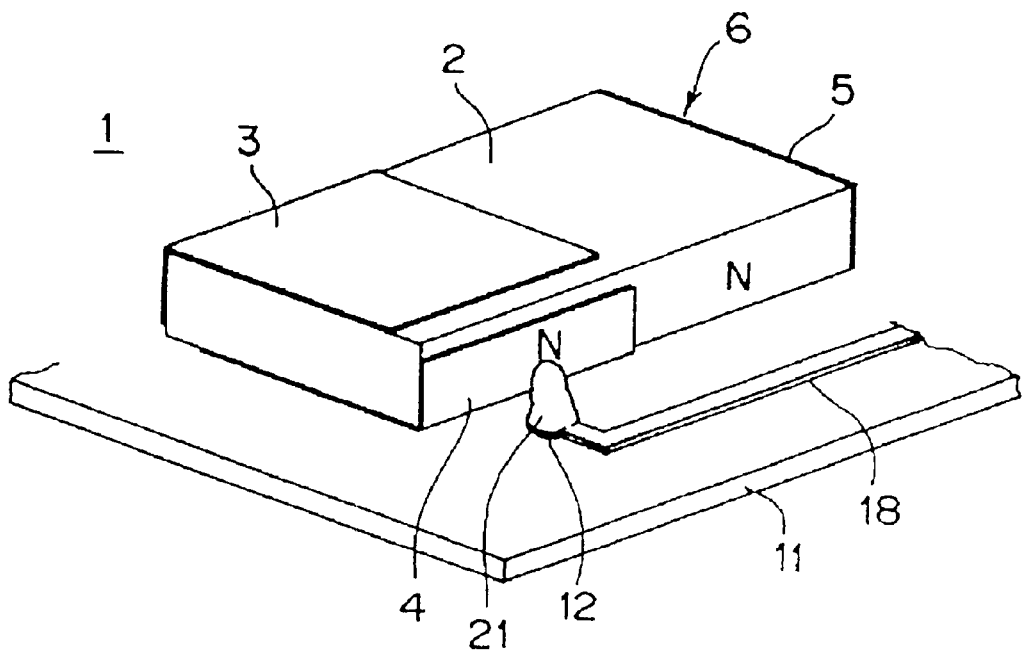
FIG. 2 is a perspective view showing a state in which the electronic component shown in FIG. 1 is assembled.
Figure 3:
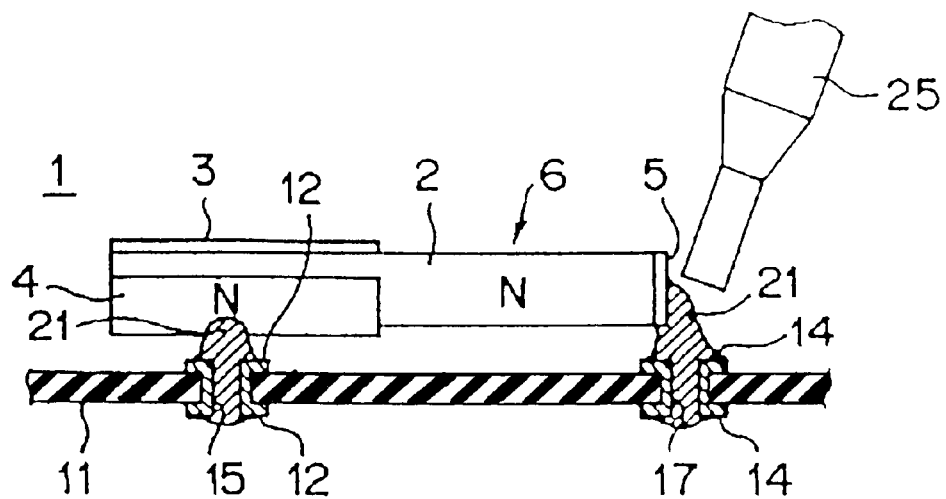
FIG. 3 is a side view of the electronic component shown in FIG. 1.

As shown in FIGS. 2 and 3, after the piezoelectric transformer element 6 is positioned near the mounting substrate 11 in a state in which the transformer element 6 is spaced slightly apart from the top surface of the mounting substrate 11 by a predetermined distance, a conductive bonding agent 21 is applied to the side surface of the piezoelectric transformer element 6 by a dispenser 25 and the like and hardened, and thereby the mounting is performed.

A more detailed description of the mounting process will now be given. The conductive bonding agent 21 is applied to the portion of the node N of vibration of the input electrode 4 provided on the surface of a front-facing side of the piezoelectric plate 2 and to the terminal electrode 12, and the through hole 15 is also filled with the conductive bonding agent 21 such that the conductive bonding agent 12 is located in the through hole and also extends from the through hole 15 above an upper surface of the mounting substrate 11 into contact with the transformer 6. In a similar manner, the conductive bonding agent 21 is applied to the portion of the node N of vibration of the input electrode 3 provided on the surface of the rear-facing side of the piezoelectric plate 2 and to the terminal electrode 13, and the through hole 16 is also filled with the conductive bonding agent 21 such that the conductive bonding agent extends in the through hole 16 and above the through hole 16 and surface of the substrate 11 into contact with the transformer. As a result of this arrangement, the piezoelectric transformer element 6 is supported at the node N of vibration on the mounting substrate 11 by the conductive bonding agent 21 extending from the through holes 15, 16.

Further, the bonding agent 21 is applied to the central portion of the output electrode 5 provided on the surface of a right-facing side of the piezoelectric plate 2 and to the terminal electrode 14, and the through hole 17 is also filled with the conductive bonding agent 21 such that the conductive bonding agent 21 extends in and above the through hole 17 and above the mounting substrate 11 into contact with the transformer 6. In this way, the electrodes 3 to 5 of the transformer 6 are electrically connected to the terminal electrodes 12 to 14, respectively, by the conductive bonding agent 21 and the transformer is physically connected to and supported on the mounting substrate 11 so as to allow the transformer 6 to vibrate freely while also ensuring reliable electrical connections between the respective electrodes.

The conductive bonding agent 21 preferably has conductivity and elasticity, and contains a conductive filler, a binder, and an additive. Au powder, Ag powder, Cu powder, Ni powder, Al powder, carbon black, graphite, a carbon fiber, or Ag-plated particles are preferably used as the conductive filler. Also, an acryl resin, an epoxy resin, a vinyl resin, an acryl-denatured polyurethane resin, a rubber-type resin, or an epoxy polyamide resin are preferably us ed as the binder. Further, the additive preferably contains a dispersant which improves the dispersibility of a conductive filler, a lubricant which provides resistance to wear, an anti-settling agent for a conductive filler and the like.

In the piezolectric transformer 1 having the above construction, the piezoelectric transformer element 6 is supported on the mounting substrate 11 via the conductive bonding agent 21 having elasticity. As a result, the vibration of the piezoelectric transformer element 6 is not hindered, because of the elasticity of the conductive bonding agent 21 Further, since the through holes 15 to 17 provided in the mounting substrate 11 and corresponding to locations of holes in the respective electrodes 12, 13, 14 are filled with the conductive bonding agent 21, the contact area between the conductive bonding agent 21 and the piezoelectric plate 2 is increased. The bonding structure of the conductive bonding agent 21 and the mounting substrate 2 is a combination structure which combines the horizontal bonding surface of the terminal electrodes 12 to 14 and the conductive bonding agent 21, with the vertical bonding surface of the through holes 15 to 17 and the conductive bonding agent 21. With this unique arrangement t, the conductive bonding agent 21 filling the through holes 15 to 17 functions as a wedge such that the conductive agent 21 is secured to the inner wall of the through holes 15 to 17. Therefore, this novel arrangement increases the bonding strength between the conductive bonding agent 21 and the mounting substrate 11 without decreasing the elasticity of the conductive bonding agent 21.

Furthermore, if instead of using the novel arrangement of the preferred embodiments of the present invention, the contact area for the conductive bonding agent is simply increased, the area where the conductive bonding agent is applied is increased. Consequently, the area where the piezoelectric transformer element is supported by the conductive bonding agent becomes significantly larger. Therefore, the vibration of the piezoelectric transformer element is hindered by an amount corresponding to the increased support area, causing a deterioration in the characteristics of the piezoelectric transformer.

However, in the piezoelectric transformer 1 of the first preferred embodiment, the support area of the piezoelectric transformer element 6 by the conductive bonding agent 21 is not increased. Therefore, it is possible to increase the bonding strength between the conductive bonding agent 21 and the mounting substrate 11 without affecting the characteristics of the piezoelectric transformer 1.

Figure 4:
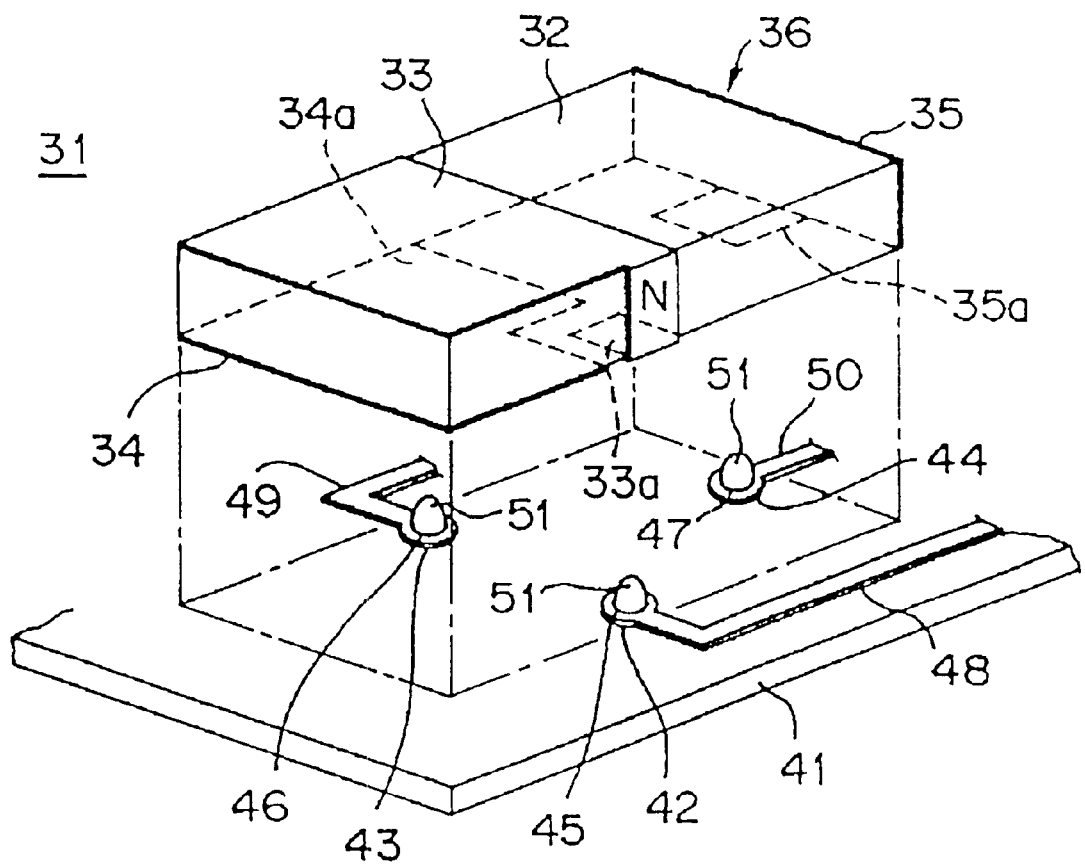
FIG. 4 is an exploded perspective view showing a second preferred embodiment of the electronic component of the present invention.

As shown in FIG. 4, a piezoelectric transformer 31 includes a piezoelectric transformer element 36 and a mounting substrate 41. The piezoelectric transformer element 36 is preferably a Rosen type transformer and includes input electrodes 33 and 34 and an output electrode 35 provided on a piezoelectric plate 32. The input electrode 33 is provided on the top surface of and extends along a first half of the piezoelectric plate 32. The input electrode 34 is provided on the bottom surface of and extends along the first half of the piezoelectric plate 32. The output electrode 35 is provided on edge surface of a side of the piezoelectric plate 32 which is opposite to the first half of the piezoelectric plate 32. This piezoelectric transformer element 36 preferably utilizes a fundamental (primary) vibration mode called a ½ mode, in which a node N of vibration at which the vibration displacement is zero is present at a position of one half (½) along the length direction of the piezoelectric plate 32, and the loop of the vibration at which the vibration displacement is maximum is present at both ends of the piezoelectric plate 32.

In the input electrode 34, one corner portion of the two corner portions positioned at the node N of vibration is removed, and the remaining corner portion defines an extension section 34a of the input electrode 34. The input electrode 33 has an extension section 33a which extends over the surface of the front-facing side of the piezoelectric plate 32 to the corner portion where the input electrode 34 is removed. The output electrode 35 has an extension section 35a which extends over the surface of the right-facing side of the piezoelectric plate 32 to the bottom surface of the piezoelectric plate 32.

Figure 6:
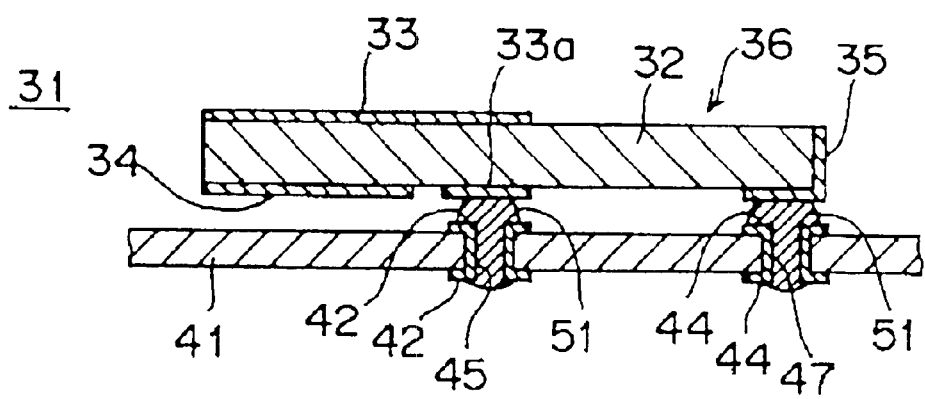
FIG. 6 is a sectional view showing a state in which the electronic component shown in FIG. 4 is assembled.

The mounting substrate 41 has terminal electrodes 42, 43, and 44 (see FIG. 6) provided on both the top and bottom surface, with through holes 45, 46, and 47 provided in the terminal electrodes 42, 43, and 44, respectively. Circuit patterns 48, 49, and 50 are connected to the terminal electrodes 42, 43, and 44, respectively.

Figure 5:
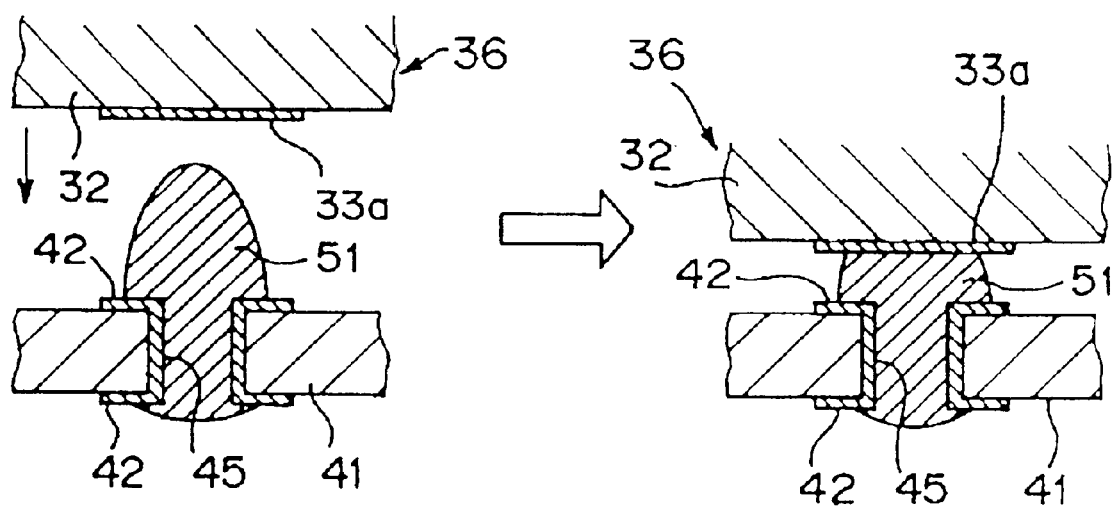
FIG. 5 is a sectional view showing the steps for assembling the electronic component shown in FIG. 4.

When the piezoelectric transformer element 36 is mounted onto the mounting substrate 41, a conductive bonding agent 51 is preferably applied to the through holes 45 to 47 and the terminal electrodes 42 to 44 via printing, a dispenser, or the like, and then the piezoelectric transformer element 36 is lowered toward the mounting substrate 11 with the input electrode 34 being located on the lower side, as shown in FIG. 5. Then, the piezoelectric transformer element 36 is positioned such that the conductive bonding agent 51 contacts the extension sections 33a to 35a of the input electrodes 33 to 35, and is spaced apart from the top surface of the mounting substrate 11 by a predetermined distance defined by the conductive bonding agent 51, after which the conductive bonding agent 51 is hardened.

As a result, the piezoelectric transformer element 36 is supported at the node N of vibration on the mounting substrate 41 by the conductive bonding agent 51 in a manner similar to that described above with reference to the preferred embodiment shown in FIGS. 1–3. The input electrodes 33 to 35 are electrically connected to the terminal electrodes 42 to 44, respectively, by the conductive bonding agent 51. The piezoelectric transformer 31 having the above-described construction and arrangement exhibits the same operational effect and advantages as that of the piezoelectric transformer 1 of the first preferred embodiment.

Figure 7:
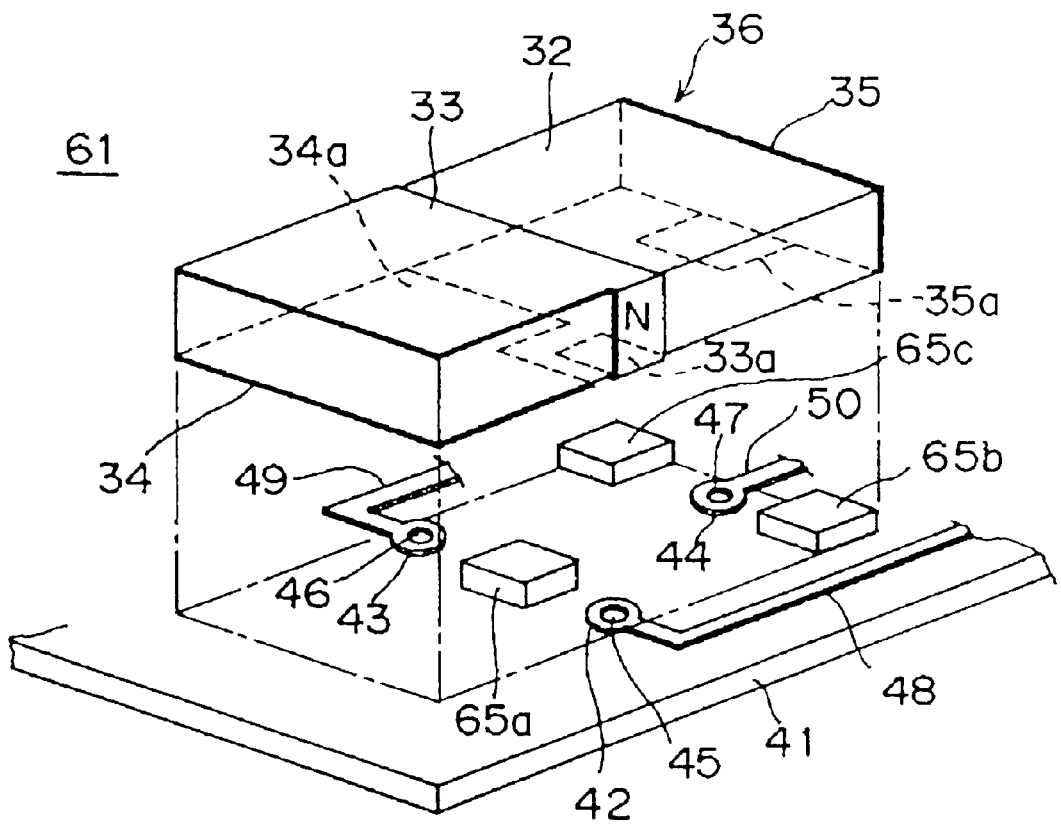
FIG. 7 is an exploded perspective view showing a third preferred embodiment of the electronic component of the present invention.

As shown in FIG. 7, a piezoelectric transformer 61 of the third preferred embodiment is preferably the same as the piezoelectric transformer 31 of the second preferred embodiment except for adhesive elastic bodies 65a to 65c. The adhesive elastic body 65a is disposed between the terminal electrodes 42 and 43 on the mounting substrate 41 so as to contact the central portion of the piezoelectric plate 32. In a similar manner, the adhesive elastic bodies 65b and 65c are disposed on two sides such that the terminal electrode 44 on the mounting substrate 41 is located therebetween so as to contact the corner portions of the right-facing side of the piezoelectric plate 32. The adhesive elastic bodies 65a to 65c preferably have elasticity, as well as bonding, adhesion, or close-contact properties. For example, a two-sided adhesive tape of cold-bonding or cure-bonding type, a rubber sheet, such as silicon rubber, having adhesion properties, a gel, such as an acryl gel, having adhesion and close-contact properties, or the like, may preferably be used.

Figure 8:
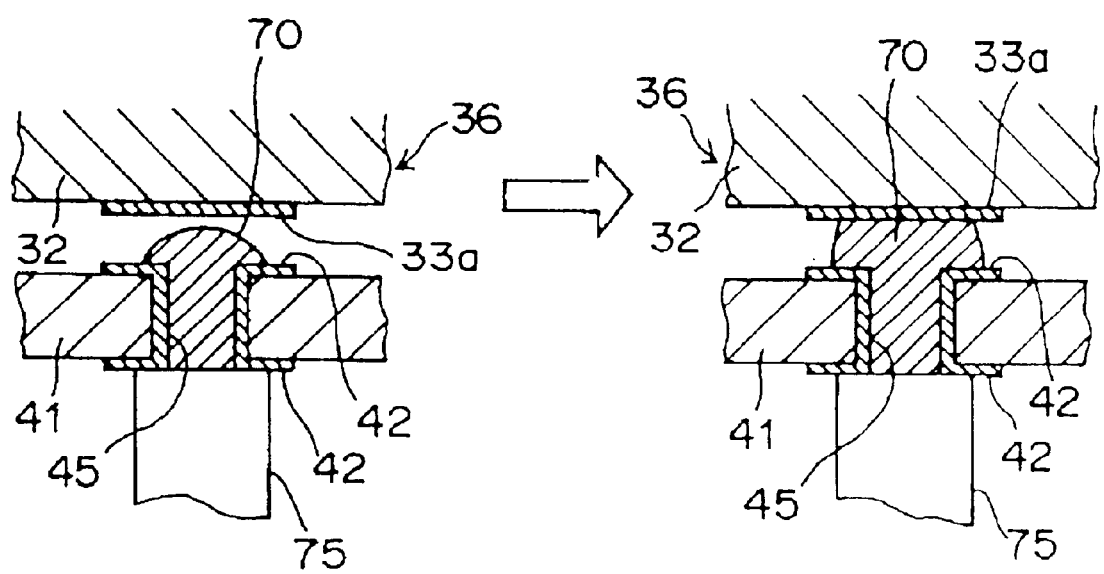
FIG. 8 is a perspective view showing the steps for assembling the electronic component shown in FIG. 7.

The piezoelectric transformer element 36 is mounted to the mounting substrate 41 by using the adhesive elastic bodies 65a to 65c preferably according the following procedure. Initially, the piezoelectric transformer element 36 is pressed against the top surface of the adhesive elastic bodies 65a to 65c of the mounting substrate 41, and the piezoelectric transformer element 36 is bonded to the adhesive elastic bodies 65a to 65c so that the transformer element 36 is positioned in place. Next, as shown in FIG. 8, a dispenser 75 disposed on the bottom side of the mounting substrate 41 is positioned to abut the lower opening of the through holes 45 to 47, and a conductive bonding agent 70 is injected into the through holes 45 to 47. The conductive bonding agent 70 is filled into the through holes 45 to 47, and further, pressed out of the through holes 45 to 47 from the upper opening section of the through holes 45 to 47. The pressed-out conductive bonding agent 70 reaches the extension sections 33a to 35a of the input electrodes 33 to 35 facing the through holes 45 to 47, causing the conductive bonding agent 70 to be brought into contact with the extension sections 33a to 35a. When a sufficient contact area between the conductive bonding agent 70 and the extension sections 33a to 35a is obtained, the dispenser 75 is removed from the mounting substrate 41, and the conductive bonding agent 70 is hardened. As a result, the piezoelectric transformer element 36 is supported at the node N of vibration on the mounting substrate 41 by the conductive bonding agent 70 and the adhesive elastic bodies 65a and 65b, and the input electrodes 33 to 35 are electrically connected to the terminal electrodes 42 to 44, respectively, by the conductive bonding agent 70.

The piezoelectric transformer 61 having the above-described construction exhibits the same operational effect and advantages as that of the piezoelectric transformer 1 of the first preferred embodiment. Further, in the piezoelectric transformer 61 of the third preferred embodiment, after the pressing force, when the piezoelectric transformer element 36 is bonded to the adhesive elastic bodies 65a to 65c, is released, the conductive bonding agent 70 is applied. Therefore, a cylindrical conductive bonding agent 70 having a reliably accurate and uniform diameter is obtained, and the cohesive failure value of the conductive bonding agent 70 with respect to an external force is increased. Also, by injecting the conductive bonding agent 70 into the through holes 45 to 47 from the bottom surface of the mounting substrate 41 in a state in which the piezoelectric transformer element 36 and the mounting substrate 41 are positioned in advance, the method of manufacturing the piezoelectric transformer 61 is greatly simplified.

A fourth preferred embodiment will be described with reference to an example of a gyroscope for use in, for example, a navigation system which detects the position of a moving body by detecting, for example, the angular velocity and performs an appropriate guidance, a yaw rate sensor which detects an external vibration and performs an appropriate vibration control, or the like.

Figure 9:
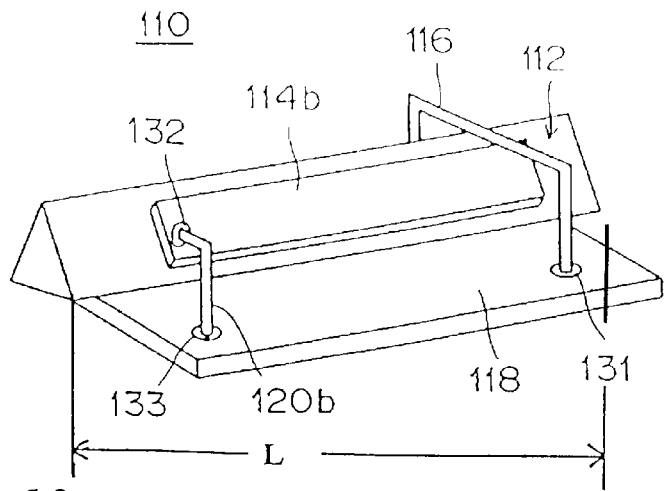
FIG. 9 is a perspective view showing a preferred embodiment of a gyroscope of the present invention.

As shown in FIG. 9, a gyroscope 110 includes a vibrator 112 and a mounting substrate 118 for mounting the vibrator 112. The vibrator 112, which is preferably formed from a constant-elastic-modulus metallic material, such as elinver, preferably has a shape of a substantially regular triangular prism. The three side surfaces of the vibrator 112 include piezoelectric elements 114a, 114b, and 114c, respectively. Each of the piezoelectric elements 114a, 114b, and 114c preferably includes a piezoelectric body and electrodes located on both sides of the respective piezoelectric body. One electrode of each of the piezoelectric elements 114a, 114b, and 114c is bonded to the side surface of the vibrator 112. The piezoelectric elements 114a, 114b, and 114c are constructed to include two nodes of the flexing vibration of the-vibrator 112. If, for example, the length of the vibrator 112 is denoted as L, the node of the vibrator 112 is located at a position of about 0.224L from both ends of the vibrator 112 along its axis. Therefore, the lengths of the piezoelectric elements 114a, 114b, and 114c are preferably formed so as to be about 0.552L. In this gyroscope 110, for example, the piezoelectric elements 114a and 114b are used for driving and detecting an output signal, and the piezoelectric element 114c is used for feedback to a driving circuit.

Figure 10:
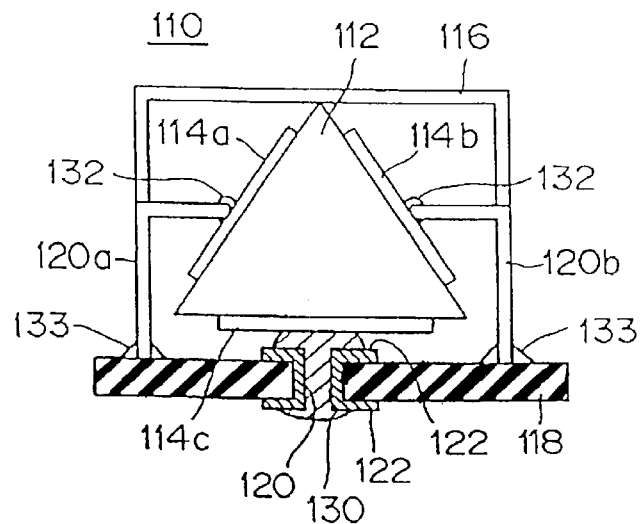
FIG. 10 is a side view of the gyroscope shown in FIG. 9.

The mounting substrate 118 has a terminal electrode 122 provided on both the top and bottom surface (see FIG. 10), with a through hole 120 being provided in each of the terminal electrodes 122. The mounting substrate 118 is preferably formed from, for example, glass epoxy.

When the gyroscope 110 is mounted onto the mounting substrate 118, a support member 116 is mounted on one side ridge portion of the vibrator 112 near one of the nodes. The support member 116 preferably has a shape of a sideways U, and the central portion thereof is mounted on the ridge of the vibrator 112. Further, both ends of the support member 116 are fixed to the mounting substrate 118 preferably via a bonding agent 131 or the like.

At near the other node of the vibrator 112, the piezoelectric element 114c and the terminal electrode 122 of the mounting substrate 118 are electrically connected to each other and fixed together via a conductive bonding agent 130. That is, the conductive bonding agent 130 is applied to the through hole 120 and the terminal electrode 122 by printing, a dispenser, or the like, and then the vibrator 112 is lowered toward the bonding agent 130 on the mounting substrate 118 with the piezoelectric element 114c being on the lower surface thereof. Then, after the vibrator 112 is positioned in a state in which the vibrator 112 is spaced from the top surface of the mounting substrate 118 by a predetermined distance created by the bonding agent 130, the conductive bonding agent 130 is hardened. The conductive bonding agent 130 preferably has conductivity and elasticity.

Further, at near the other node of the vibrator 112, other support members 120a and 120b are mounted to the piezoelectric elements 114a and 114b, respectively. The support members 120a and 120b preferably have the shape of a hook, and one end of the support members 120a and 120b is electrically connected to the piezoelectric elements 114a and 114b, respectively, by a conductive bonding agent 132 or the like. The other end of the support members 120a and 120b is electrically connected to the mounting substrate 118 and fixed together by a conductive bonding agent 133 or the like. These support members 120a and 120b are preferably made of a conductor, such as a metal, but may be formed from a material such that metal plating or the like is deposited onto an insulator.

In the gyroscope 110, the support members 120a and 120b and the conductive bonding agent 130 are used to support the vibrator 112, as well as for input and output of signals to and from the piezoelectric elements 114a, 114b, and 114c. In this case, for example, an oscillation circuit or the like is connected as a feedback loop for self-excitation driving between the support members 120a and 120b and the conductive bonding agent 130. In accordance with the signal from this oscillation circuit, the vibrator 112 flexes and vibrates in a direction substantially at right angles to the surface where the piezoelectric element 114c is formed. In this state, when the gyroscope 110 rotates about its axis, the vibration direction of the vibrator 112 varies by the Coriolis force. This causes a difference between the voltages generated in the piezoelectric elements 114a and 114b used for detecting an output signal, and by measuring this output difference, the rotational angular velocity can be detected.

In the gyroscope 110, the support member 116 is connected to the ridge portion of the vibrator 112 near one node of the vibrator 112, and the support members 120a and 120b and the conductive bonding agent 130 are connected to the piezoelectric elements 114a, 114b, and 114c, respectively, near the other node of the vibrator 112. For this reason, the loss of the vibration of the vibrator 112 can be minimized by the elasticity of the support members 116, 120a, and 120b, and the conductive bonding agent 130. Since the through hole 120 provided in the mounting substrate 118 is also filled with the conductive bonding agent 130 in a manner similar to that described above with reference to the first preferred embodiment shown in FIGS. 1–3, the contact area between the conductive bonding agent 130 and the mounting substrate 118 is significantly increased, and the conductive bonding agent 130 filled into the through hole 120 functions as a wedge such that the conductive adhesive agent is firmly secured to the inner wall of the through hole 120. Therefore, the bonding strength between the conductive bonding agent 130 and the mounting substrate 118 is greatly increased.

Figure 11:
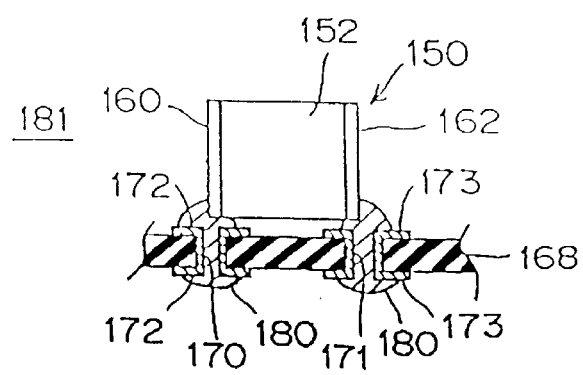
FIG. 11 is a partial perspective view showing a preferred embodiment of a multilayered piezoelectric component of the present invention.

A fifth preferred embodiment will be described by using as an example a multilayered piezoelectric component for use in, for example, an oscillator, a discriminator, a filter or other such electronic component. As shown in FIG. 11, a multilayered piezoelectric component 181 includes a multilayered piezoelectric element 150 and a mounting substrate 168 for mounting the multilayered piezoelectric element 150.

Figure 12:
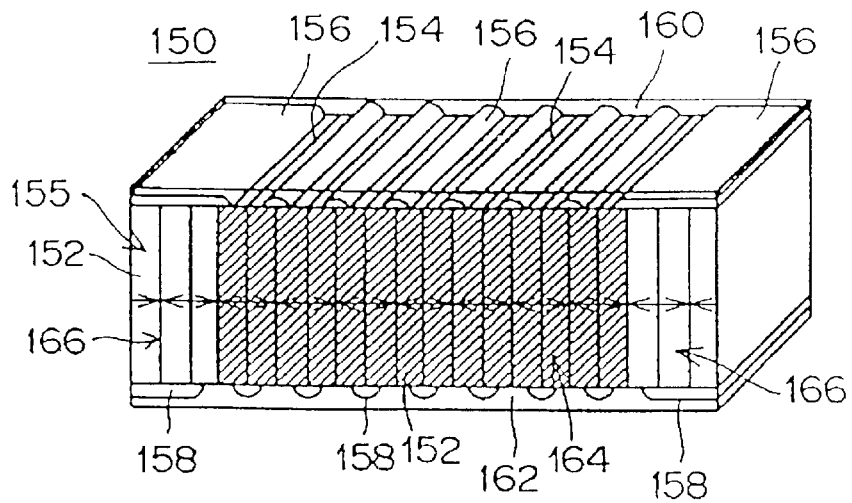
FIG. 12 is a perspective view of the multilayered piezoelectric component shown in FIG. 11.

As shown in FIG. 12, the multilayered piezoelectric element 150 includes piezoelectric layers 152 and electrodes 154 arranged alternately into a multilayered body 155 in the shape of a substantially rectangular parallelepiped. As a material for the piezoelectric layers 152, for example, a piezoelectric ceramic material is used. The respective piezoelectric layers 152 are arranged in such a way that the polarization directions of the adjacent piezoelectric layers 152 are opposite to each other. The arrows shown in FIG. 12 indicate the polarization directions. The end portions of the electrodes 154 are exposed at two opposing side surfaces (the side surfaces positioned on the top side and the bottom side in FIG. 12) of the multilayered body 155.

A plurality of insulating films 156 and 158 are disposed on the two side surfaces where the end portions of the electrodes 154 are exposed, respectively. In FIG. 12, the exposed portion of every other electrode 154 is covered with the insulating film 156 on the top side of the multilayered body 155. Also, the exposed portion of every other electrode 154 is covered with the insulating film 158 on the bottom side of the multilayered body 155. However, some of the electrodes 154 on both end portions of the multilayered body 155 have a continuous covering of the insulating films 156 and 158. In the fifth preferred embodiment, three electrodes 154 from both ends of the multilayered body 155 have a continuous covering of the insulating film 156. Also, two electrodes 154 from both ends of the multilayered body 155 have a continuous covering of the insulating film 158. Further, input and output electrodes 160 and 162 are disposed on the side surface on which the insulating films 156 and 158 of the multilayered body 155 are located. Therefore, the electrodes 154 which are not covered with the insulating film 156 are connected to the electrode 160, and the electrodes 154 which are not covered with the insulating films 158 are connected to the electrode 162.

In this multilayered piezoelectric element 150, since an electric field is applied between the adjacent electrodes 154 in the central portion of the multilayered body 155, the piezoelectric layers 152 are piezoelectrically active. However, since at both end portions of the multilayered body 155 the electrodes 154 are electrically insulated from both of the input and output electrodes 160 and 162 by the insulating films 156 and 158, an electric field is not applied between the adjacent electrodes 154, and the piezoelectric layers 152 are inactive from a piezoelectric point of view. Therefore, as shown by the shaded portions in FIG. 12, an active section 164 for the input signal is defined in the central portion of the multilayered body 155, and an inactive section 166 for the input signal is defined at both end portions.

In the multilayered piezoelectric element 150, as a result of providing a signal to the input and output electrodes 160 and 162, voltages in mutually opposite directions are applied to the piezoelectric layers 152, which are polarized in mutually opposite directions, of the active section 164 and therefore, all the active sections 164 expand or contract in the same direction. For this reason, the entire multilayered piezoelectric element 150 is excited in a longitudinal vibration mode in which the central portion of the multilayered body 155 is a node. Furthermore, in the multilayered piezoelectric element 150, the polarization directions of the piezoelectric layers 152 of the active section 164 coincide with the direction of the electric field which is created in accordance with the signal and the vibration direction. That is, this multilayered piezoelectric element 150 is a resonator utilizing a piezoelectric longitudinal effect.

A mounting substrate 168 has terminal electrodes 172 and 173 provided on both the top and bottom surfaces (see FIG. 11), with through holes 170 and 171 being provided in the terminal electrodes 172 and 173, respectively.

When the multilayered piezoelectric element 150 is mounted onto the mounting substrate 168, the input and output electrodes 160 and 162 and the terminal electrodes 172 and 173 of the mounting substrate 168 are electrically connected to each other and fixed together via a conductive bonding agent 180 near the node (the central portion of the multilayered body 155) of the multilayered piezoelectric element 150 and the conductive bonding agent 180 supports the element 150 in a manner similar to that described above with reference to the first preferred embodiment shown in FIGS. 1–3. That is, the conductive bonding agent 180 is applied to the through holes 170 and 171 and the terminal electrodes 172 and 173 by printing, a dispenser or the like, and then the multilayered piezoelectric element 150 is lowered toward the mounting substrate 168 such that the plane of the input and output electrodes 160 and 162 is arranged in a direction substantially perpendicular to the mounting substrate 168. Then, after the multilayered piezoelectric element 150 is positioned in a state in which the multilayered piezoelectric substrate 168 is spaced apart from the top surface of the mounting substrate 168 by a predetermined distance by the conductive bonding agent 180, the conductive bonding agent 180 is hardened. The conductive bonding agent 180 preferably has conductivity and elasticity.

In the multilayered piezoelectric component 181 having the above construction, since the multilayered piezoelectric element 150 is supported on the mounting substrate 168 via the conductive bonding agent 180 having elasticity, the vibration of the multilayered piezoelectric element 150 is not hindered because of the elasticity of the conductive bonding agent 180. Since the through holes 170 and 171 provided in the mounting substrate 168 are filled with the conductive bonding agent 180, the contact area between the conductive bonding agent 180 and the mounting substrate 168 is increased, and the conductive bonding agent 180 filled into the through holes 170 and 171 functions as a wedge so as to be firmly secured to the inner wall of the through holes 170 and 171. Therefore, the bonding strength between the conductive bonding agent 180 and the mounting substrate 168 is greatly increased.

The support structure of the piezoelectric vibrator and the piezoelectric transformer having such a support structure of the piezoelectric vibrator, the gyroscope, and the multilayered piezoelectric component in accordance with preferred embodiments of the present invention are not limited to the above-described preferred embodiments, and can be changed in various ways within the scope of the present invention.

Figure 13:
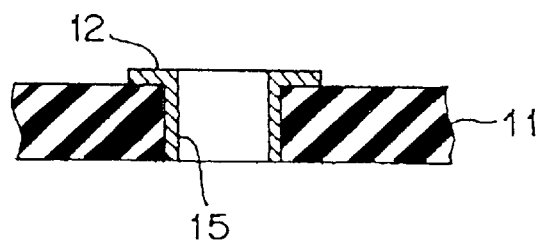
FIG. 13 is a sectional view showing a modification of a hole used in preferred embodiments of the present invention.
Figure 14:
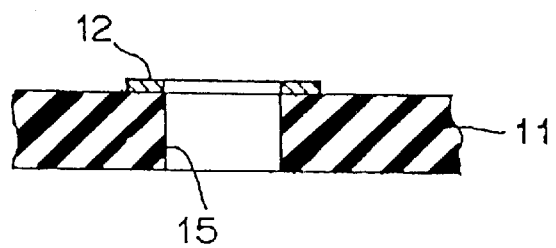
FIG. 14 is a sectional view showing another modification of a hole used in preferred embodiments of the present invention.
Figure 15:
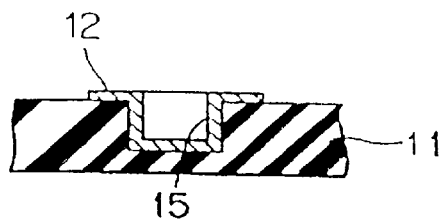
FIG. 15 is a sectional view showing still another modification of a hole used in preferred embodiments of the present invention.
Figure 16:
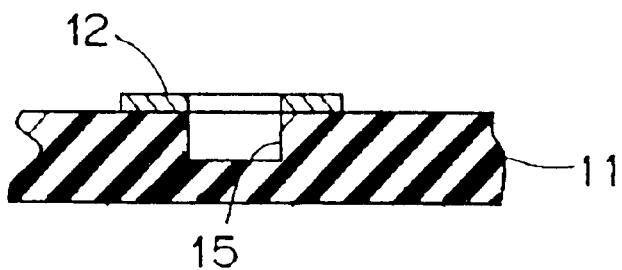
FIG. 16 is a sectional view showing yet still another modification of a hole used in preferred embodiments of the present invention.
Figure 17:
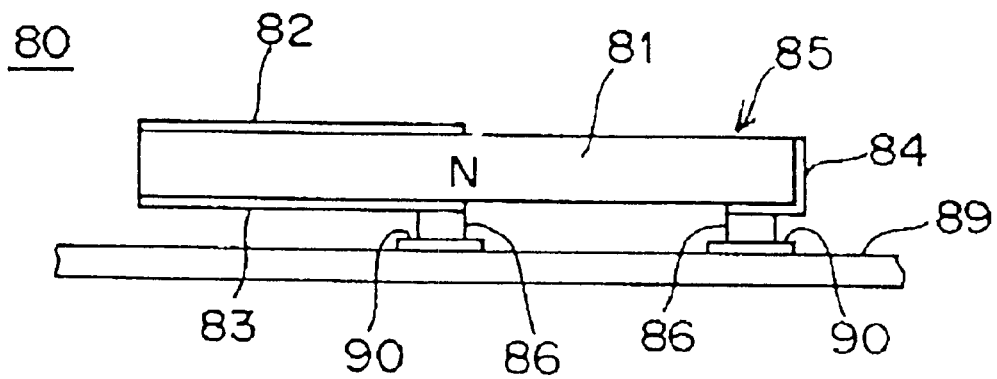
FIG. 17 is a side view showing a conventional piezoelectric transformer.
Figure 18:
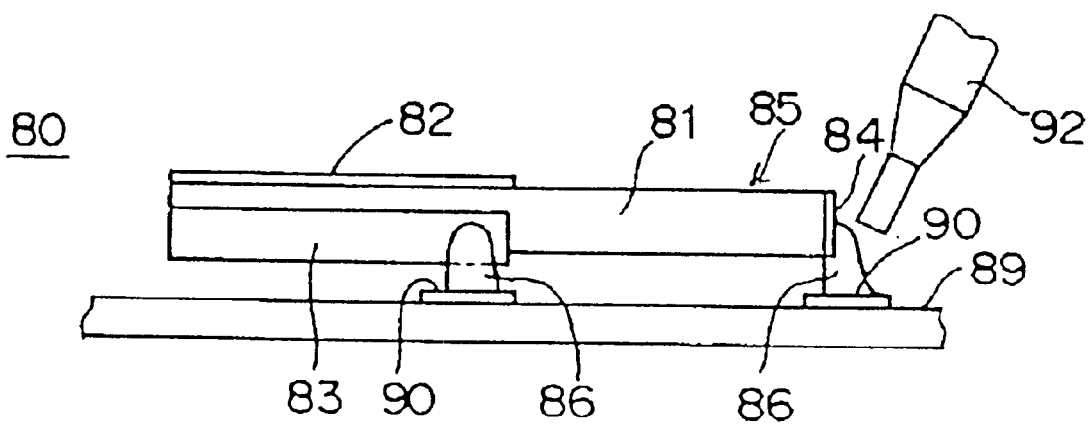
FIG. 18 is a side view showing another conventional piezoelectric transformer.

The hole or holes formed in the mounting substrate may be a hole connected to the terminal electrode 12 provided at only the top surface of the mounting substrate 11, as shown, for example, in FIG. 13, and as shown in FIG. 14, may be a hole 15 which does not have a conductor provided at its inner wall. Further, the hole 15 formed in the mounting substrate 11 may be a via-hole such as that shown in FIG. 15, or a blind hole, such as that shown in FIG. 16, which does not have a conductor provided in its inner wall.

Although in the first to third preferred embodiments, the output electrode of the piezoelectric transformer element is electrically connected to the terminal electrode of the mounting substrate by the conductive bonding agent, the output and terminal electrodes may be electrically connected by a lead wire, a ribbon wire, or the like. Further, as described in the third preferred embodiment, after the piezoelectric transformer element 36 is mounted to the mounting substrate 41, the conductive bonding agent 70 is preferably applied. However, after the conductive bonding agent 70 is applied in advance onto the surfaces of the terminal electrodes 42 to 44 and into the through holes 45 to 47, the piezoelectric transformer element 36 may be mounted to the mounting substrate 41 while pressing the piezoelectric transformer element 36 against the top surface of the adhesive elastic bodies 65a to 65c of the mounting substrate 41. In this case, when the piezoelectric transformer element 36 is pressed against the adhesive elastic bodies 65a to 65c, the conductive bonding agent 70 is pressed back. Then, when the pressing force is released, the piezoelectric transformer element 36 is slightly spread out by the elastic force of the adhesive elastic body, and a phenomenon occurs in which the diameter of the central portion in the height direction of the conductive bonding agent 70 which is exposed from the top surface of the mounting substrate 41 is significantly reduced.

As is clear from the foregoing description, according to preferred embodiments of the present invention, since a hole is provided in the mounting substrate, and the hole is filled with a conductive bonding agent, the contact area between the conductive bonding agent and the mounting substrate is greatly increased, and the conductive bonding agent filled into the hole functions as a wedge such that the conductive bonding agent is firmly secured to the inner wall of the hole. Therefore, the bonding strength between the conductive bonding agent and the mounting substrate can be increased without decreasing the elasticity of the conductive bonding agent.

Further, since the piezoelectric transformer element, the vibrator of the gyroscope, or the multilayered piezoelectric element is supported on the mounting substrate via the conductive bonding agent having elasticity, the vibration of the piezoelectric transformer element, the vibrator of the gyroscope, or the multilayered piezoelectric element is not hindered because of the elasticity of the conductive bonding agent. Also, since the bonding strength between the conductive bonding agent and the mounting substrate and the shape of the conductive bonding agent is stable, the connection resistance value becomes constant, and variations in the electrical characteristics of the piezoelectric transformer, the gyroscope, or the multilayered piezoelectric component are greatly reduced.

Further, by adjusting the diameter of the hole, it is possible to reduce the support area of the piezoelectric transformer, the gyroscope, or the multilayered piezoelectric component by the conductive bonding agent. Therefore, the hindrance of the vibration of the piezoelectric transformer, the gyroscope, or the multilayered piezoelectric component is greatly reduced by an amount corresponding to the reduced support area, thereby preventing a decrease in the efficiency of the piezoelectric transformer, the gyroscope, or the multilayered piezoelectric component.

While the invention has been particularly shown and described with reference to preferred embodiments thereof, it will be understood by those skilled in the art that the foregoing and other changes in form and details may be made therein without departing from the spirit of the invention.

What is claimed is:

1. A support apparatus for an electronic component having an electrode extending along the body thereof, the support apparatus comprising:
   a mounting substrate to mount the electronic component thereon;
   at least one terminal electrode provided within and on the mounting substrate;
   a hole provided in the mounting substrate and located at a position corresponding to a position of the terminal electrode, the terminal electrode being located inside of the hole and extending to and along a top surface and a bottom surface of the mounting substrate; and
   a conductive and elastic bonding agent including a conductive filler, a binder and an additive disposed in the hole and above the hole by a distance D, the conductive and elastic bonding agent being arranged to electrically connect the electrode extending along the body of the electronic component to the terminal electrode and to separate the electronic component and the mounting substrate by the distance D.

2. The support apparatus according to claim 1, wherein the at least one terminal electrode provided on the mounting substrate has a hole provided therein and located in alignment with the hole provided in the mounting substrate, the conductive bonding agent being located in the hole provided in the mounting substrate and the hole provided in the at lest one terminal electrode.

3. The support apparatus according to claim 1, further comprising a plurality of terminal electrodes, a plurality of holes provided in each of the plurality of electrodes and a plurality of holes provided in the mounting substrate, each of the plurality of holes provided in the respective plurality of terminal electrodes being aligned with a respective one of the plurality of holes provided in the mounting substrate, the conductive bonding agent being located in the plurality of holes provided in the mounting substrate and the plurality of holes provided in the plurality of terminal electrodes.

4. The support apparatus according to claim 1, wherein a first portion of the terminal electrode extends along a portion of the top surface of the mounting substrate and a second portion of the terminal electrode extends along a portion of the bottom surface of the mounting substrate that is substantially equal to the portion of the top surface of the mounting surface along which the first portion of the terminal electrode extends.

5. The support apparatus according to claim 4, wherein the conductive bonding agent extends onto but not beyond the first and second portions of the terminal electrode.

6. An electronic component apparatus comprising:
   a mounting substrate;
   an electronic component mounted on the mounting substrate;
   at least one terminal electrode provided within and on the mounting substrate;
   a hole provided in the mounting substrate and located at a position corresponding to a position of the terminal electrode, the terminal electrode being located inside of the hole and extending to and along a top surface and a bottom surface of the mounting substrate; and
   a conductive and elastic bonding agent including a conductive filler, a binder and an additive disposed in the hole and above the hole by a distance D, the conductive and elastic bonding agent being arranged to electrically connect the electronic component to the at least one terminal electrode extending along the body of the electronic component to the terminal electrode and to separate the electronic component and the mounting substrate by the distance D.

7. The electronic component apparatus according to claim 6, wherein the at least one terminal provided on the mounting substrate has a hole formed therein and located in alignment with the hole formed in the mounting substrate, the conductive and elastic bonding agent being located in the hole formed in the mounting substrate and the hole formed in the at least one terminal electrode.

8. The electronic component apparatus according to claim 6, further comprising a plurality of terminal electrodes, a plurality of holes provided in each of the plurality of electrodes and a plurality of holes provided in the mounting substrate, each of the plurality of holes provided in the respective plurality of terminal electrodes being aligned with a respective one of the plurality of holes provided in the mounting substrate, the conductive bonding agent being located in the plurality of holes provided in the mounting substrate and the plurality of holes provided in the plurality of terminal electrodes.

9. The electronic component apparatus according to claim 6, wherein said electronic component is supported on said mounting substrate only by said conductive bonding agent.

* * * * *